United States Patent
Hizawa (10) Patent No.: US 6,818,554 B2
(45) Date of Patent: Nov. 16, 2004

(54) METHOD FOR FABRICATING A SEMICONDUCTOR DEVICE HAVING A METALLIC SILICIDE LAYER

(75) Inventor: Kazuya Hizawa, Miyagi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 29 days.

(21) Appl. No.: 10/283,189

(22) Filed: Oct. 30, 2002

(65) Prior Publication Data

US 2003/0096491 A1 May 22, 2003

(30) Foreign Application Priority Data

Nov. 20, 2001 (JP) ......................................... 2001-354411

(51) Int. Cl.[7] ............................................. H01L 21/44
(52) U.S. Cl. ........................................ 438/660; 438/664
(58) Field of Search ................................ 438/149, 151, 438/581, 685, 682–683, 655–656, 660, 663–664

(56) References Cited

U.S. PATENT DOCUMENTS 6,054,386 A * 4/2000 Prabhakar .................. 438/682

2002/0061639 A1 * 5/2002 Itonaga ...................... 438/592

FOREIGN PATENT DOCUMENTS

| JP | 10-335261 | 12/1998 |
| JP | 2000-082811 | 3/2000 |

OTHER PUBLICATIONS

J. Fukuhara et al., "The Orientation of Blanket W–CVD on the underlayer Ti/TiN studied by XRD," ADMETA 2000: Asian Session, pp. 71 and 72.

Kunihiro Fujii et al., "Sub–Quarter Micron Titanium Salicide Technology With In–Situ Silicidation Using High–Temperature Sputtering," 1995 Symposium on VLSI Technology Digest of Technical Papers, pp. 57 and 58.

* cited by examiner

Primary Examiner—David Nelms
Assistant Examiner—David Vu
(74) Attorney, Agent, or Firm—Volentine Francos, PLLC

(57) ABSTRACT

A protective layer is formed on a metallic layer prior to forming a metallic silicide layer, and the protective layer has a thickness thicker than that of the metallic layer.

20 Claims, 8 Drawing Sheets

(c) LONG THROW SPUTTERING (b) COLLIMATING SPUTTERING (a) GENERAL SPUTTERING

METHOD FOR FABRICATING A SEMICONDUCTOR DEVICE HAVING A METALLIC SILICIDE LAYER

CROSS-REFERENCE TO RELATED APPLICATION

The present application claiming priority under 35 U.S.C. §119 to Japanese Application No. 2001-354411 filed on Nov. 20, 2001 which is hereby incorporated by reference in its entirely for all purposes.

BACKGROUND OF THE INVENTION

1. Field of the Invention

The present invention relates to a method for fabricating a semiconductor device which has a metallic silicide layer.

2. Description of the Related Art

In a method for fabricating a semiconductor process, a metallic silicide layer is used for a gate electrode, an active region or conductive line in order to realize lower resistance.

A self-aligned silicide (SALICIDE) method is well known as a method for forming the metallic silicide layer. In the SALICIDE method, first a metallic layer, such as refractory metal is formed on a silicon substrate, and then plural heat treatments are carried out. Generally, a first heat treatment is for forming a metallic silicide in a surface of the substrate by diffusing a material of the metallic layer into the substrate. Other heat treatments are for reducing a resistance of the metallic silicide layer. Thereby, the metallic silicide layer can be formed in predetermined portions in the substrate by a self-aligned method.

Such SALICIDE method is disclosed in Japanese Laid-Open Patent Publication:HEI10-335261, published on Dec. 18, 1998, Japanese Laid-Open Patent Publication:2000–82811, published on Mar. 21, 2000, "Sub-Quarter Micron Titanium Salicide Technology With In-Situ Silicidation Using High-Temperature Sputtering" NEC Corporation, 1995 Symposium on VLSI Technology Digest of Technology Papers, p.57–58 and "The Orientation of Blanket W-CVD on the underlayer Ti/TiN studied by XRD" Toshiba Corporation Semiconductor Company, ADMETA2000:Asian Session, PS-'210, p71–72.

On the other hand, a SOI (Silicon-On-Insulator) structure having a thin single silicon layer formed on an insulating film on a silicon substrate is well known as a structure for realizing lower power consumption.

A technique for applying the SALICIDE method to the SOI structure has been developing in order to realize both a lower resistance and lower power consumption.

A single silicon layer of a fully depleted SOI structure is very thin. Generally, a thickness of such single silicon layer is less than 50 nm. In the case where a thickness of a metallic layer formed on the single silicon layer is 25 nm, a thickness of metallic silicide layers formed in an active region (source and drain regions) becomes 50 nm. That is, the metallic silicide layer in the fully depleted SOI structure might be contacted with the insulating film under the thin single silicon layer without making precisely adjustments to a thickness of the metallic layer formed on the single silicon layer. Such contacted area makes a contact resistance between the metallic silicide layer and the single silicon layer larger since an interface region between the metallic silicide layer and the single silicon layer becomes smaller. Further, in the case where a thickness of the metallic layer is very thicker than that of the single silicon layer, quantity of silicon in the single silicon region is insufficient for reacting with metal in the metallic layer. As a result, voids occur in the active region due to lack of silicon in the single silicon layer.

Therefore, in the case where the SALICIDE method is applied for the SOI structure, a process for forming a thin metallic layer on the active region for forming a thin metallic silicide layer is required.

However, thin wire effect is well known in the conventional silicide process. That is, the narrower a width of the metallic silicide layer becomes, the larger a sheet resistance of the metallic silicide layer becomes. Further, the thin wire effect is remarkable in the thin metallic silicide layer.

SUMMARY OF THE INVENTION

In a preferred embodiment of the invention, a protective layer is formed on a metallic layer prior to a step for forming a metallic silicide layer, and the protective layer has a thickness thicker than that of the metallic layer.

According to the present invention, a semiconductor device having a thin metallic silicide layer can be formed with reducing a sheet resistance by thin wire effect.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a MOS transistor.

First, an outline of a conventional process is shown in FIGS. 1–5. A method for forming a titanium silicide layer is described hereinafter.

Figure 1:
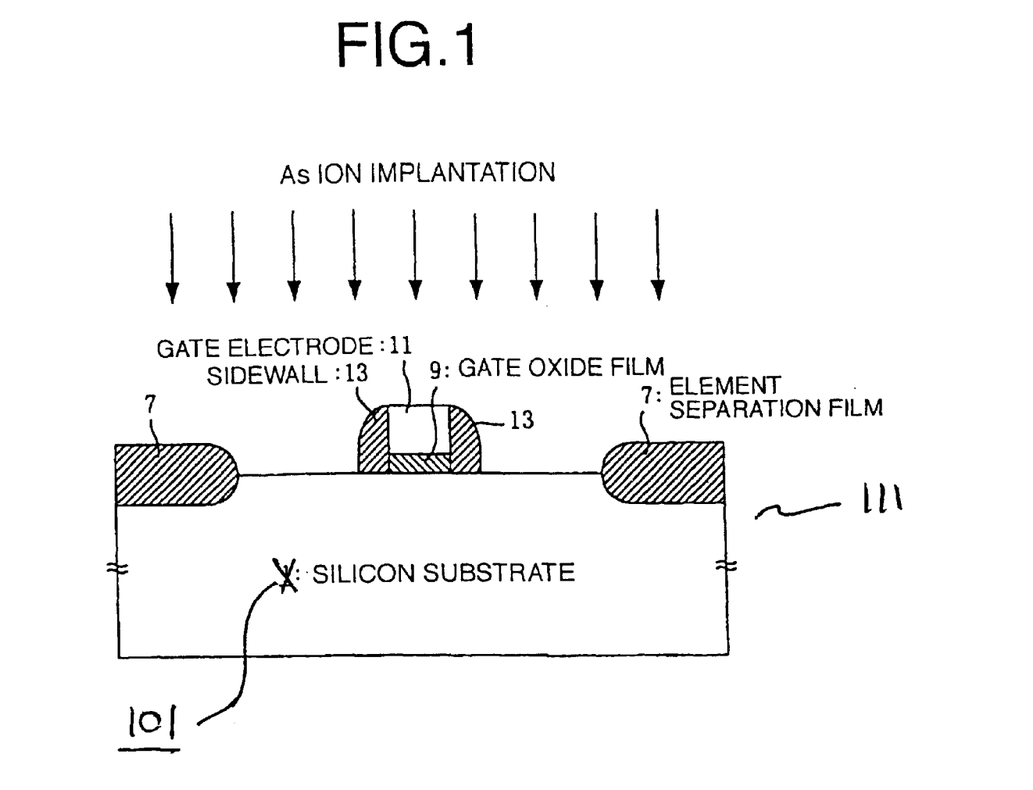
FIG. 1–FIG. 5 are partial cross-sectional views describing a conventional method of fabricating a semiconductor device.

A gate electrode 11 which is comprised of polycrystalline silicon having a thickness of 200 nm, a gate oxide film 9 (a thickness of 10 nm) under the gate electrode 11, side walls 13 which are formed on the sides of the gate electrode 11 and field insulating layers 7 (a thickness of 400 nm) are formed on a semiconductor substrate 101, as shown in FIG. 1. These elements are defined as a base 111.

Then, an active region (source and drain regions; not shown) are formed by an ion implantation which introduces p type ions or n type ions into the base 111.

Then, arsenic ions As+ are implanted into the base 111 at $3 \times 10^{14}$ cm$^{-2}$. Thereby, surfaces of the semiconductor substrate 101 become amorphous.

Figure 2:
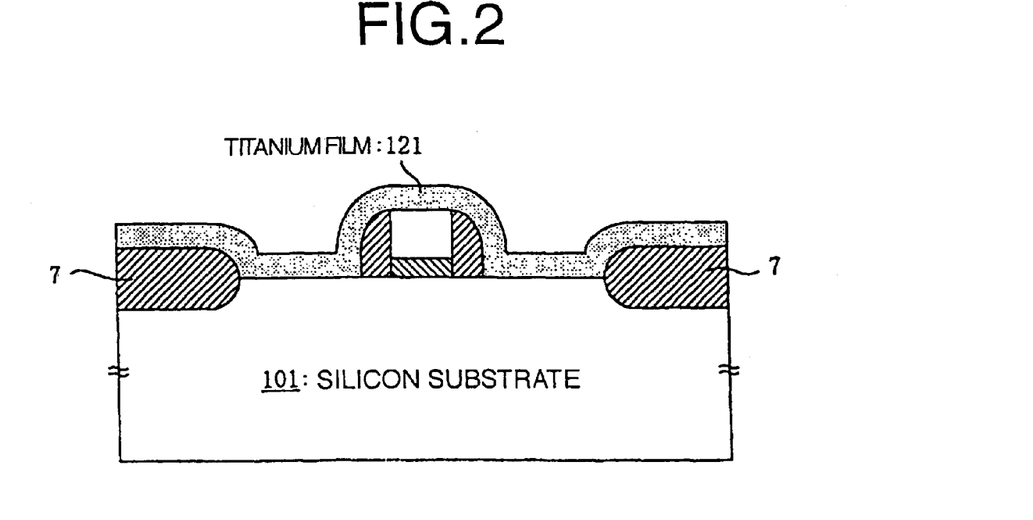

Next, a titanium layer 121 (a thickness of 20 nm) as a metallic layer is formed on the base 111 by a sputtering method, as shown in FIG. 2.

Figure 3:
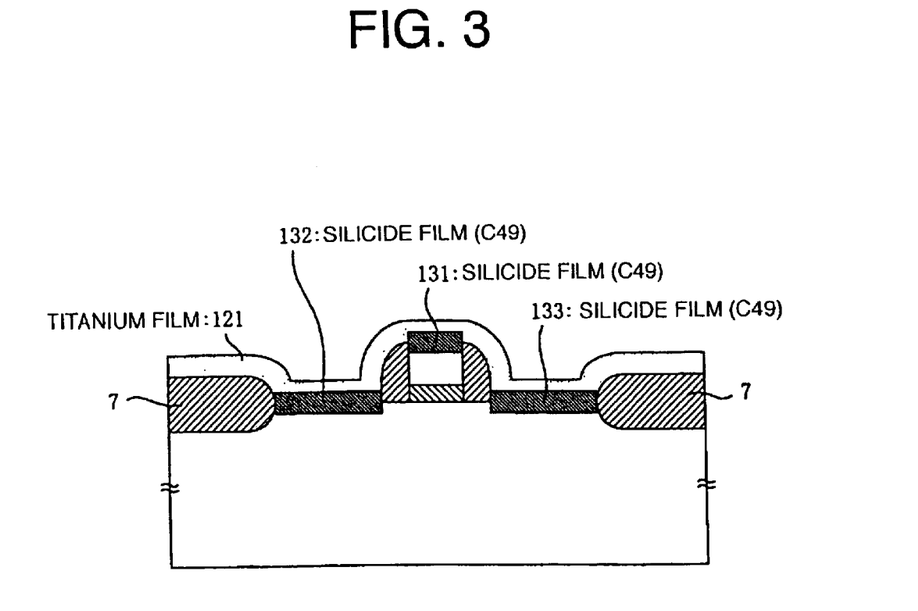

Then, a first heat treatment is carried out. That is, the base 111 on which the titanium layer 121 is formed, is heated to a temperature of 750° C. in an atmosphere of nitrogen, as shown in FIG. 3. Thereby, titanium silicide layers 131, 132, 133 (a thickness of 60 nm) are formed in interface surfaces. The titanium silicide layers 131, 132, 133 are respectively formed on the interface surfaces between the titanium layer 121 and the active regions and the gate electrode 11. Such titanium silicide layers 131, 132, 133 are composed of a Ti—Si layer which has a composition ratio of titanium and silicon that is 1:1 or a Ti$_2$Si layer which includes more titanium than silicon. So, resistance of the titanium silicide layers 131, 132, 133 is high. That is, the titanium layers 131, 132, 133 have a crystalline structure of C49.

Figure 4:
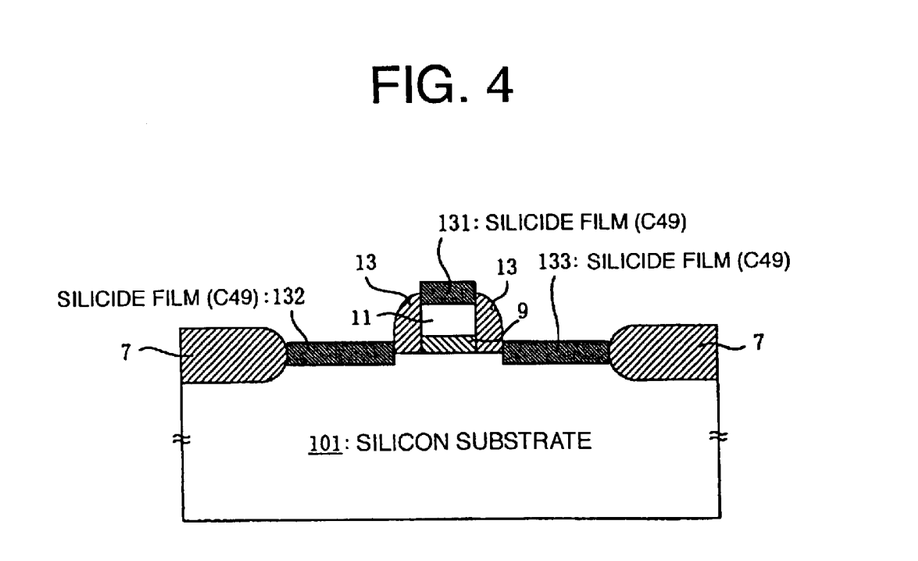

Then, the titanium layer 132 which is not reacted with silicon in the semiconductor substrate 101 is removed using mixture liquid of an ammonia solution and a hydrogen peroxide solution, as shown in FIG. 4.

Figure 5:
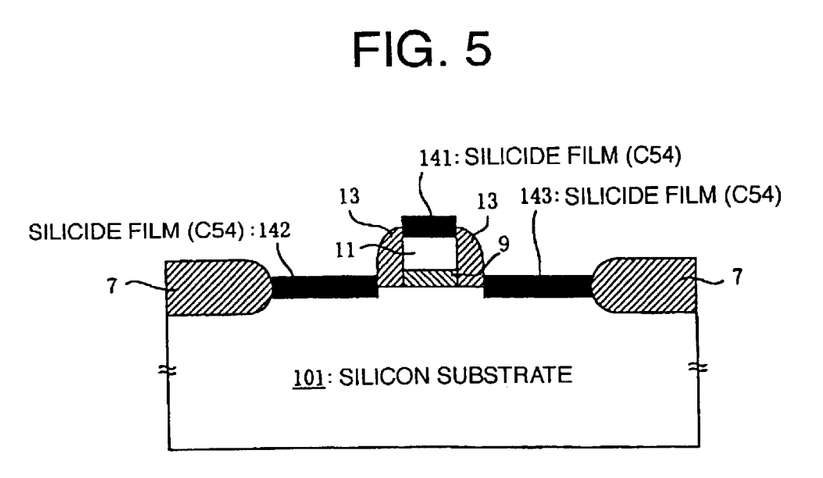

Then, a second heat treatment is carried out. That is, the titanium silicide layers 131, 132, 133 are heated to a temperature of 850° C. Thereby, the TiSi layer or the Ti$_2$Si layer of the titanium silicide layers 131, 132, 133 are respectively changed into TiSi$_2$ layers 141, 142, 143, as shown in FIG. 5. That is, the titaniumu layers (TiSi$_2$) 141, 142, 143 have a crystalline structure of C54. Therefore, as resistance of the titanium silicide layers 141, 142, 143 become low, resistance of the gate electrode 11 and the active regions can be reduced.

Then, an intermediate layer, contact holes and conductive lines are formed on the base for forming MOS transistors.

Here, an outline of a process of the present invention is shown in FIGS. 6–14.

In this embodiment, a fully depleted SOI (Silicon-On-Insulator) structure is used.

Figure 6:
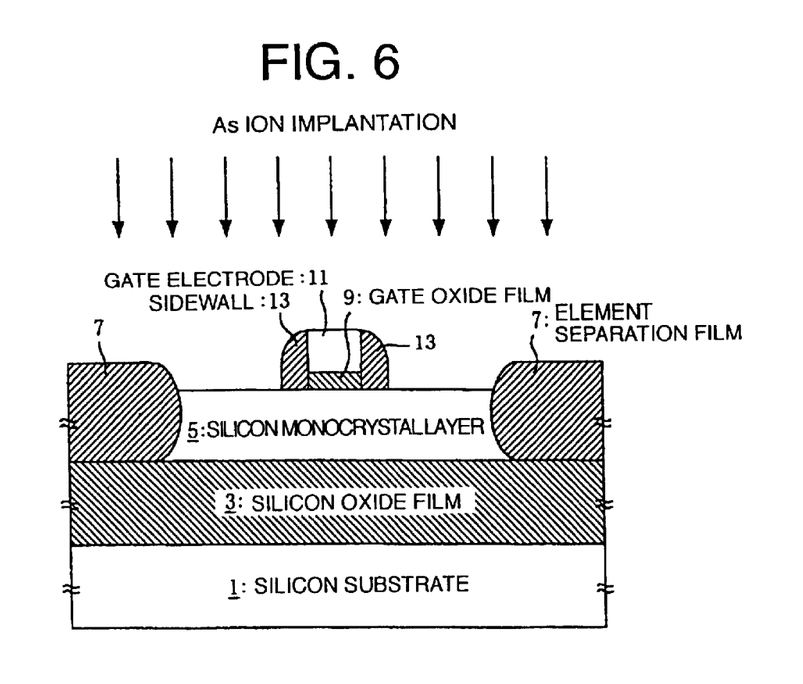
FIG. 6–FIG. 10 are partial cross-sectional views describing a method of fabricating a semiconductor device according to a preferred embodiment.

A silicon-on-insulator (SOI) substrate which is comprised of a silicon substrate 1, a silicon oxide layer 3 on the silicon substrate 1 and a single silicon layer 5 on the silicon dioxide layer 3, is used for this preferred embodiment. A gate electrode 11 which is comprised of polycrystalline silicon having a thickness of 200 nm, a gate oxide film 9 (a thickness of 10 nm) under the gate electrode 11, side walls 13 which are formed on the sides of the gate electrode 11 and field insulating layers 7 (a thickness of 100 nm) are formed on the SOI substrate, as shown in FIG. 6. Then, an active region (source and drain regions; not shown) are formed by an ion implantation which introduces p type ions or n type ions into the single silicon layer 5. Then, arsenic ions As+ are implanted into the single silicon layer 5 at $3 \times 10^{14}$ cm$^{-2}$, 30 keV. Thereby, surfaces of the single silicon layer 5 become amorphous.

Figure 7:
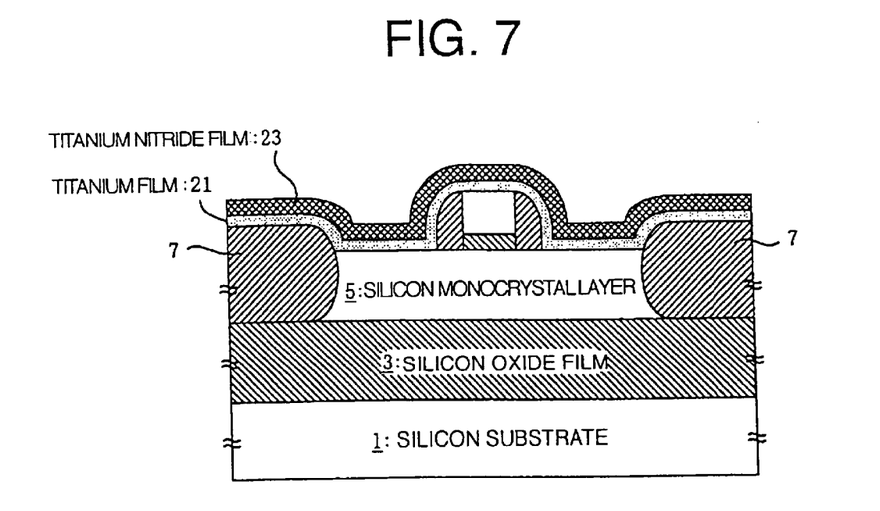

Next, a titanium layer 21 which has a thickness of 15 nm as a metallic layer is formed on the SOI substrate by a sputtering method, as shown in FIG. 7. A cobalt layer or a nickel layer can be used for the metallic layer instead of the titanium layer.

A thickness of the titanium layer 21 is set to an appropriate thickness according to a depth of the active region, that is, a depth of the single silicon layer 5. In this embodiment, as a depth of the active region in the fully depletion type SOI is less than 50 nm, a thickness of a metallic silicide layer, such as titanium silicide which is formed in the active region is necessary to be less than the depth of the active region, that is, the single silicon layer. A thickness of the metallic silicide layer becomes 2.5 times of the thickness of the metallic layer, such as the titanium layer. In this embodiment, a thickness of titanium layer 21 is set to 15 nm.

Collimate sputtering method or Long Throw sputtering method is used for forming the titanium layer 21. In these methods, metal from a metallic target can be straightly sputtered to the SOI substrate.

In the Collimate sputtering method, a collimate plate PC is arranged between a metallic target T and a semiconductor wafer SUB, as shown in FIG. 11(b). Thereby, metallic particles among all sputtered metallic particles, which have small angle of incidence can be reached to the semiconductor wafer SUB.

In the Long Throw method shown in FIG. 11(c), an interval between a metallic target and a semiconductor wafer SUB is longer that that of a general sputtering method shown in FIG. 11(a). In the general sputtering method, the interval is set to 60 nm. On the other hand, the interval of the Long Throw method is set to 340 nm. Further, a vacuum level of the Long Throw method is higher than that of the general sputtering method for enhancing straight-forwardness of the sputtered metallic particles. Metallic particles which have large angle of incidence larger than $\theta$ can not reach to the semiconductor wafer SUB in this Long Throw method. As an average of free path of the sputtered metallic particles can be longer by the high vacuum level, a scatter of the metallic particle can be reduced.

The SOI substrate is kept at a temperature of 300° C. during forming of the titanium layer 21 by the Collimate or the Long Throw method.

Figure 12:
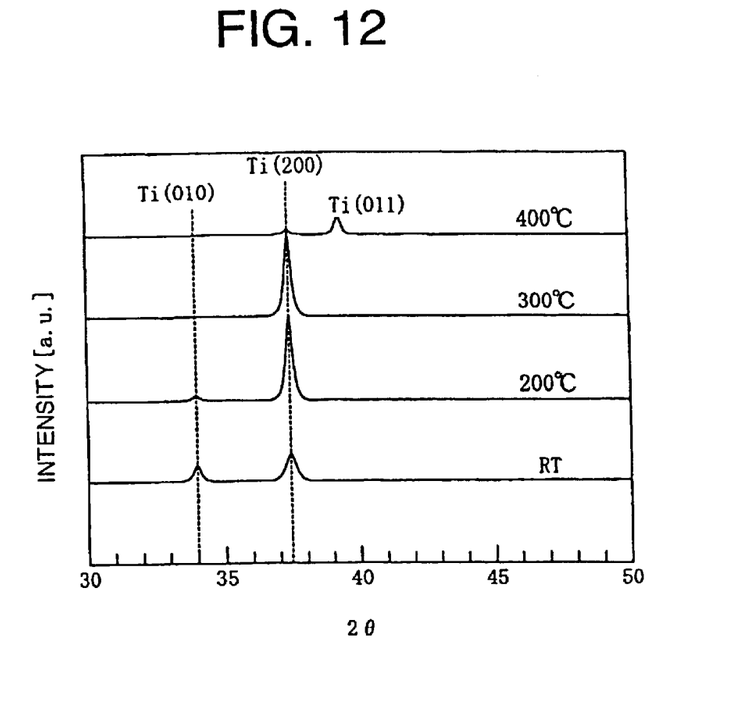
FIG. 12 is a x-ray diffraction describing a relation between orientation of (200) surface and each temperature.

Here, a x-ray diffraction of the titanium layer formed on the substrate which is kept at temperatures of 200° C., 300° C., 400° C. and a room temperature (25° C.) using the Long Throw sputtering method, is shown in FIG. 12. Referring to FIG. 12, under a temperature of 300° C., the higher a temperature of the substrate is, the stronger an orientation of (200) surface of the titanium layer becomes. An orientation of (200) surface is weak at a temperature of 400° C. Therefore, a crystalline structure of a titanium layer which is formed at a temperature between 200° C. and 400° C., differs from a crystalline structure which is formed at under 200° C. or over 400° C.

Returning to FIG. 7, a titanium nitride layer 23 having a thickness of 30 nm is formed on the titanium layer 21, which is continuous with forming the titanium layer 21 without exposing the SOI substrate to the air. The titanium layer 21 and the titanium nitride layer 23 are preferred to form successively in the same process chamber.

As the titanium nitride 23 is successively formed on the titanium layer 21 as a protective layer, the titanium layer 21 is protected from an oxidation. That is, the titanium layer which is easy to be oxidized, can be protected against a fall of quality of the titanium layer due to the oxidation. As a result, the titanium nitride layer 23 has a function of isolating the titanium layer 21 from an external oxide atmosphere. A tungsten layer can be used for the protective layer instead of the titanium nitride layer.

In this embodiment, a thickness of the protective layer, such as the titanium nitride layer 23 is thicker than that of the metallic layer, such as the titanium layer 21, for protecting the metallic layer from the oxidation. Further, the protective layer is preferred to have a thickness more than 30 nm for restraining from incursion of external oxygen.

Figure 8:
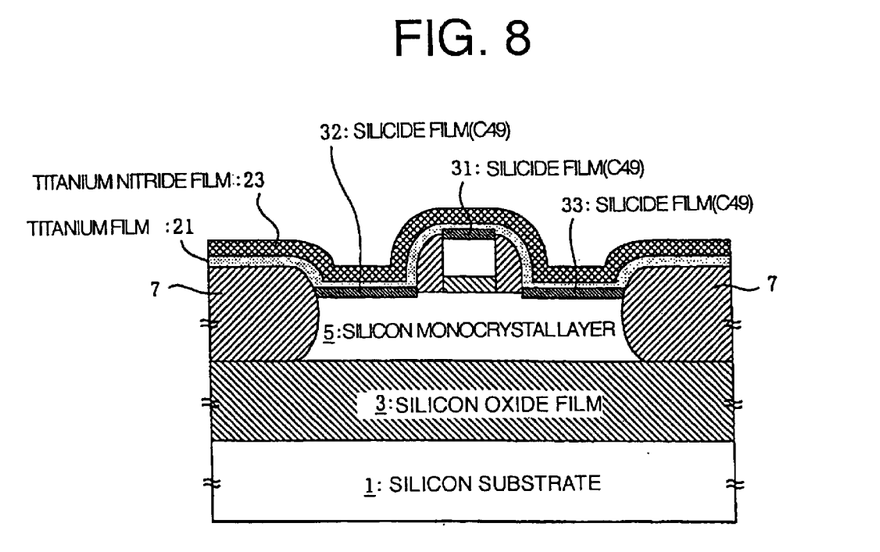

Then, a first heat treatment is carried out. That is, the SOI substrate on which the titanium layer 21 and the titanium nitride layer 23 are formed, is heated to a temperature of 750° C. in an atmosphere of nitrogen. Thereby, titanium silicide layers 31, 32, 33 which have a thickness of 30 nm respectively are formed in interface surfaces, as shown in FIG. 8. The titanium silicide layers 31, 32, 33 are respectively formed on the interface surfaces between the titanium layer 21 and the active regions and the gate electrode 11. Such titanium silicide layers 31, 32, 33 are composed of a Ti—Si layer which has a composition ratio of titanium and silicon that is 1:1 or a $Ti_2Si$ layer which includes more titanium than silicon. So, resistance of the titanium silicide layers 31, 32, 33 is high. That is, the titanium layers 31, 32, 33 have a crystalline structure of C49.

Figure 9:
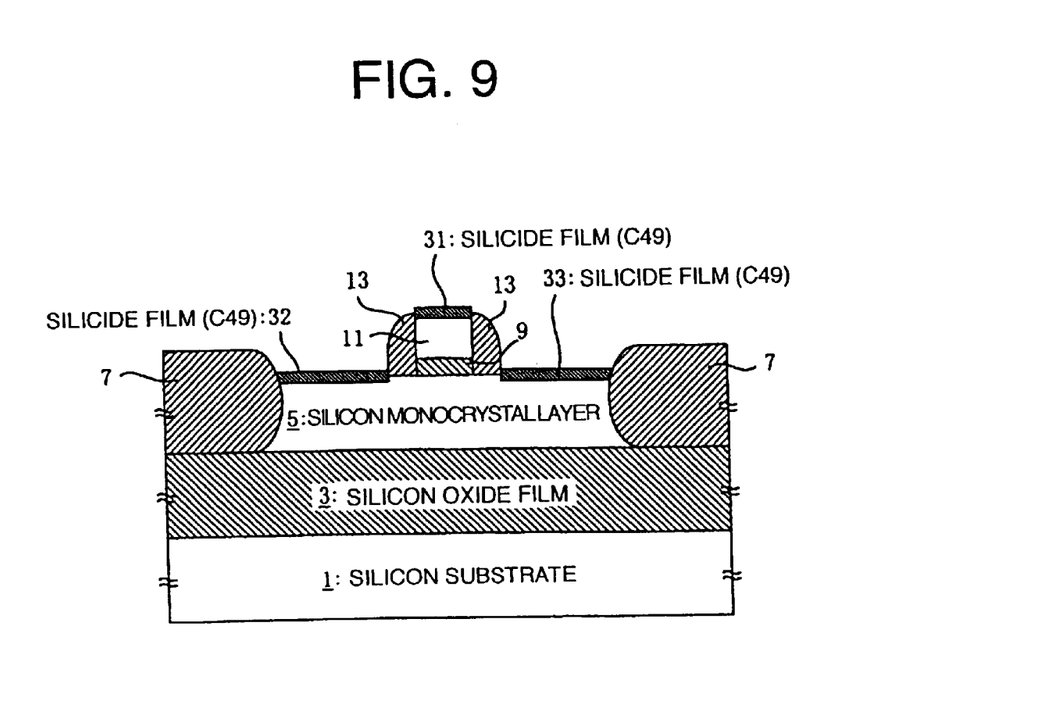

Then, the titanium nitride layer 23 and the titanium layer 32 which is not reacted with silicon in the single silicon layer 5 or the gate electrode 11, is removed using mixture liquid of an ammonia solution and a hydrogen peroxide solution, as shown in FIG. 9.

Figure 10:
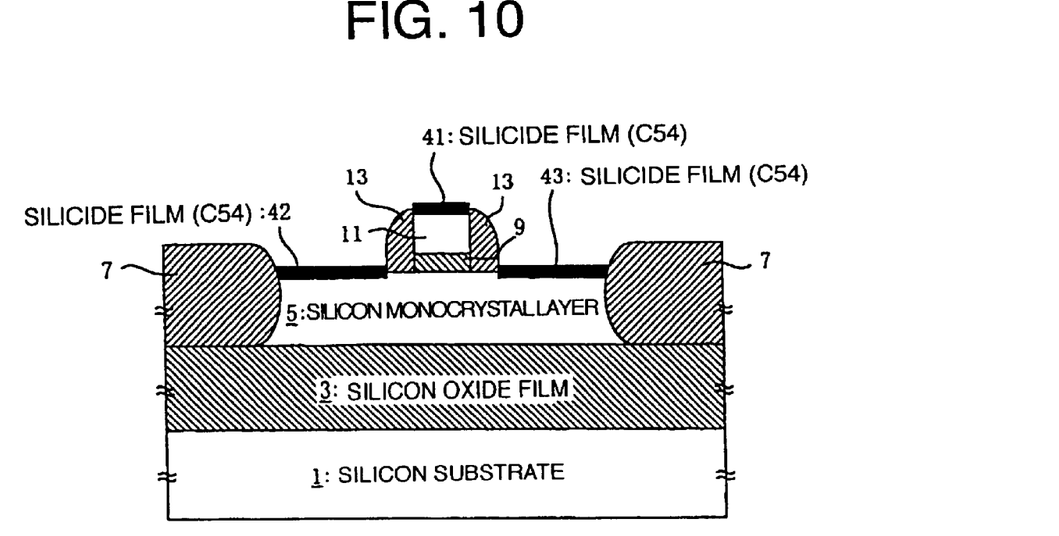
Figure 11:
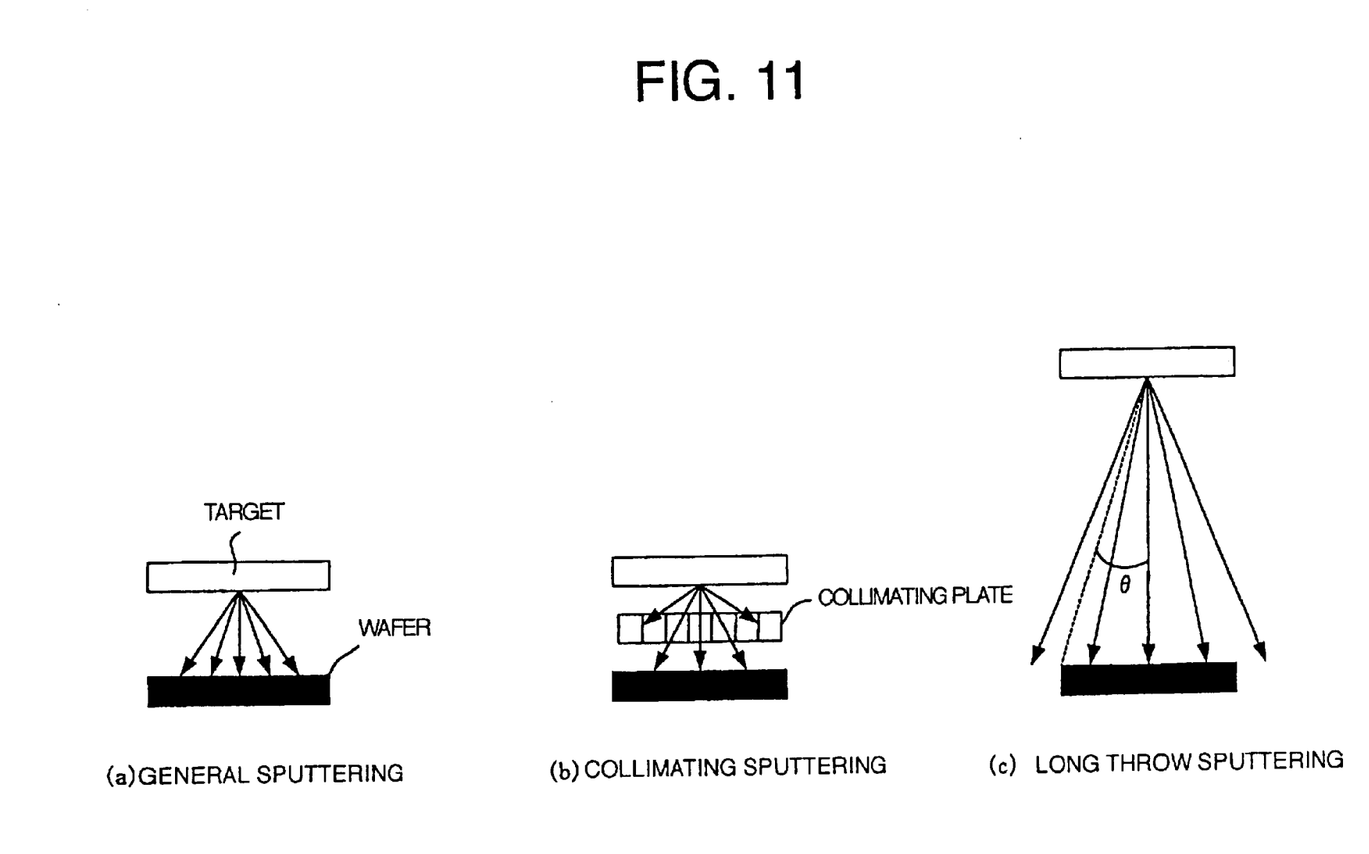
FIG. 11(a)-FIG. 11(c) are partial cross-sectional views describing various sputtering methods.

Then, a second heat treatment is carried out. That is, the titanium silicide layers 31, 32, 33 are heated to a temperature of 850° C. Thereby, the TiSi layer or the $Ti_2Si$ layer of the titanium silicide layers 31, 32, 33 are respectively changed into $TiSi_2$ layers 41, 42, 43, as shown in FIG. 10. That is, the titaniumu layers ($TiSi_2$) 41, 42, 43 have a crystalline structure of C54. Therefore, as resistance of the titanium silicide layers 41, 42, 43 become low, resistance of the gate electrode 11 and the active regions can be reduced. As thickness of the titanium silicide layers 42, 43 which are formed in the active region (the source and drain regions) is 30 nm, portions of the titanium silicide layers 42, 43 do not reach to the silicon oxide layer 3.

Then, an intermediate layer, contact holes and conductive lines are formed on the base for forming MOS transistors.

Figure 13:
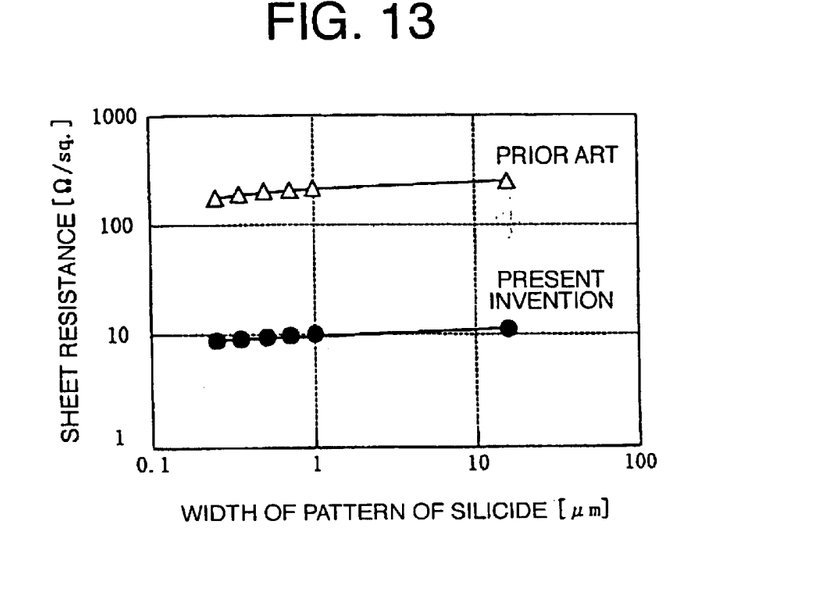
FIG. 13 is a relation between sheet resistance and width of silicide layers according to the preferred embodiment.

Although the titanium suicide layers of the preferred embodiment are very thin (30 nm), the titanium silicide layers 41, 42, 43 have low regular sheet resistance of about 10 Ω/sq, as shown in FIG. 13. Further, the sheet resistance of this embodiment is independent of width of titanium silicide layer.

In FIG. 13, black circles denote a relation between width of silicide layer and sheet resistance of the preferred embodiment. Further, white triangles denote a similar relation of the conventional silicide layer which has a thickness of 30 nm.

According to the present invention, a SALICIDE method for forming metallic silicide layers can be applied to a semiconductor substrate which has a thin silicon layer such as a SOI substrate. Particularly, in a fully depleted SOI structure which has a very thin single silicon layer, metallic silicide layers can be formed precisely.

As a result, according to the present invention, a semiconductor device having a thin metallic silicide layer can be formed with reducing a sheet resistance by thin wire effect.

Figure 14:
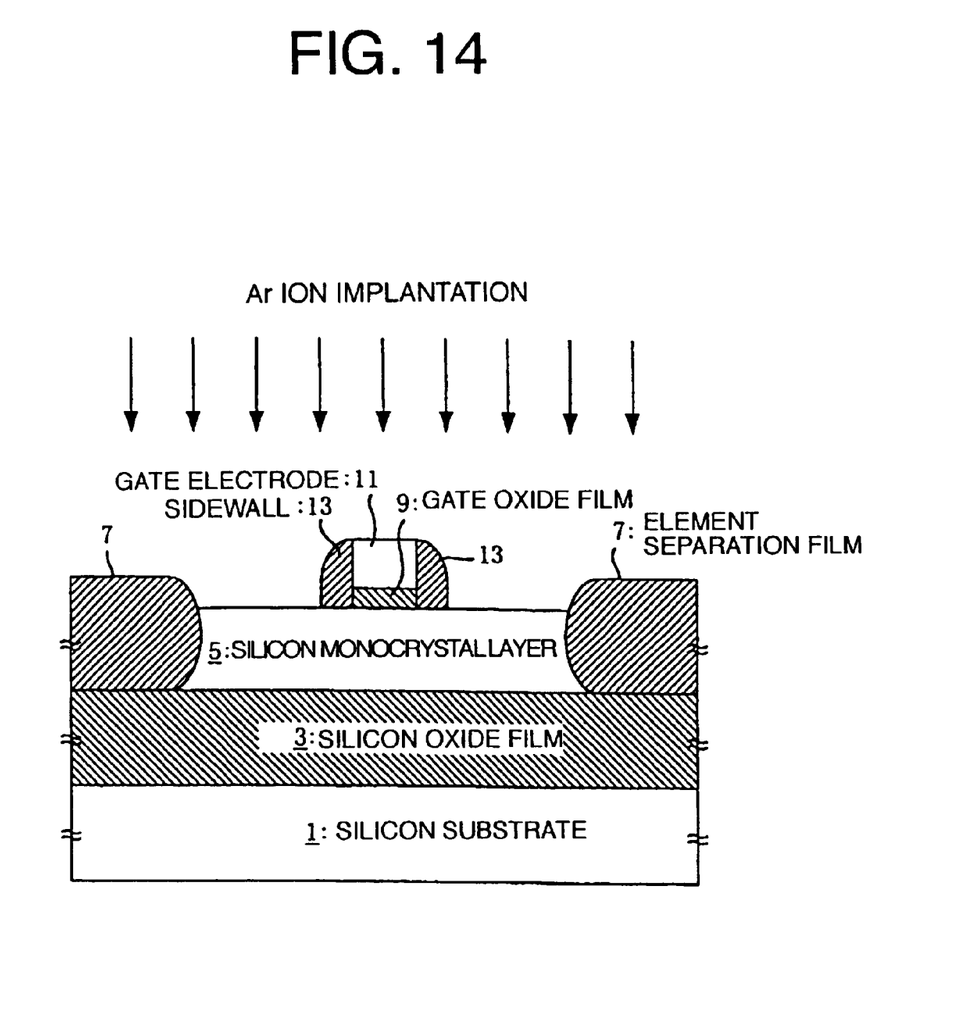
FIG. 14 is a partial cross-sectional view describing a method of another preferred embodiment.

In the above embodiment, argon ions can be implanted into the SOI substrate instead of the arsenic ions, as shown in FIG. 14. Such argon ions Ar+ are implanted into the single silicon layer 5 at $5 \times 10^{14}$ $cm^{-2}$, 15 keV. Thereby, surfaces of the single silicon layer 5 become amorphous. As the implanted argon ions in the substrate are not neither a p type impurity nor n type impurity, the argon ions have no serious effect in the active region in which p channel or n channel type transistors are formed. As a result, the transistors can be precisely formed in the active region.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A method for fabricating a semiconductor device, comprising:

preparing a substrate having a silicon region;

causing the silicon region to be amorphous by an ion implantation;

heating the substrate having the amorphous silicon region at a predetermined temperature;

forming a metallic layer on the amorphous silicon region of the heated substrate by a straight sputtering method so as to sputter straightly to the amorphous silicon region, wherein the metallic layer has a first thickness;

forming a protective layer on the metallic layer, wherein the protective layer protects the metallic layer from a surrounding atmosphere, wherein the protective layer has a second thickness greater than the first thickness; and forming a metallic silicide layer in an interface between the amorphous silicon region and the metallic layer by a heat treatment after said forming a protective layer, wherein the metallic silicide layer is comprised of metal from the metallic layer and silicon from the amorphous silicon region.

2. The method according to claim 1, wherein argon ions are implanted into the silicon region by the ion implantation.

3. The method according to claim 1, wherein the predetermined temperature is a temperature of from 200° C. to less than 400° C.

4. The method according to claim 1, wherein the metallic layer is formed on the amorphous silicon region by a long throw sputtering method or a collimate sputtering method.

5. The method according to claim 1, wherein the metallic layer is comprised of titanium, cobalt or nickel.

6. The method according to claim 1, wherein a depth of the silicon region is larger than the first thickness of the metallic layer.

7. The method according to claim 1, wherein the protective layer is comprised of titanium-nitride or tungsten.

8. The method according to claim 1, wherein the first thickness of the metallic layer is equal to or less than 15 nm.

9. The method according to claim 1, wherein the second thickness of the protective layer is equal to or more than 30 nm.

10. The method according to claim 1, wherein a source region and a drain region of an MOS transistor are formed in the silicon region, wherein the metallic silicide layer is formed in the source and drain regions.

11. The method according to claim 1, wherein the substrate has a silicon on insulator structure which has a single silicon layer formed on an insulating film.

12. A method for fabricating a semiconductor device, comprising:

preparing an SOI substrate having a single silicon region formed on an insulating film;

heating the SOI substrate at a temperature of from 200° C. to less than 400° C.;

forming a metallic layer on the single silicon region of the heated SOI substrate by a straight sputtering method so as to sputter straightly to the heated SOI substrate;

forming a protective layer on the metallic layer, wherein the protective layer protects the metallic layer from a surrounding atmosphere; and forming a metallic silicide layer in a surface of the silicon region by a heat treatment after said forming a protective layer, wherein the metallic silicide layer is comprised of metal from the metallic layer and silicon from the single silicon region.

13. The method according to claim 12, wherein the metallic layer has a first thickness, wherein the protective layer has a second thickness which is more than the first thickness of the metallic layer.

14. The method according to claim 13, wherein a depth of the silicon region is larger than the first thickness of the metallic layer.

15. he method according to claim 13, wherein the first thickness of the metallic layer is equal to or less than 15 nm.

16. The method according to claim 15, wherein the second thickness of the protective layer is equal to or more than 30 nm.

17. The method according to claim 12, wherein argon ions are implanted into the silicon region by an ion implantation before the step of heating the SOI substrate so as to form an amorphous silicon region in the silicon region.

18. The method according to claim 17, wherein the metallic layer is formed on the amorphous silicon region by a long throw sputtering method or a collimate sputtering method.

19. The method according to claim 18, wherein the metallic layer is comprised of titanium, cobalt or nickel.

20. The method according to claim 19, wherein the protective layer is comprised of titanium-nitride or tungsten.

* * * * *